United States Patent
Albright et al.

[11] Patent Number: 5,868,869
[45] Date of Patent: Feb. 9, 1999

[54] THIN FILM PHOTOVOLTAIC DEVICE AND PROCESS OF MANUFACTURE

[75] Inventors: Scot P. Albright, Lakewood, Colo.; Rhodes Chamberlin, El Paso, Tex.

[73] Assignee: Photon Energy, Inc., Golden, Colo.

[21] Appl. No.: 946,365

[22] Filed: Oct. 7, 1997

Related U.S. Application Data

[62] Division of Ser. No. 480,452, Jun. 7, 1995, Pat. No. 5,674,325.

[51] Int. Cl.$^6$ .................................... H01L 31/0384
[52] U.S. Cl. .......................... 136/250; 136/244; 136/247; 136/259; 136/260; 136/264; 136/265
[58] Field of Search ..................... 136/250, 244, 136/247, 259, 260, 264, 265

[56] References Cited

U.S. PATENT DOCUMENTS

| | | | |
|---|---|---|---|
| 2,904,613 | 9/1959 | Paradise | 136/250 |
| 3,038,952 | 6/1962 | Ralph | 437/2 |
| 3,247,477 | 4/1966 | Fridrich | 338/15 |
| 3,351,516 | 11/1967 | Weisbeck et al. | 428/413 |
| 3,522,339 | 7/1970 | Te Vezde | 264/129 |
| 3,586,541 | 6/1971 | Chamberlin | 136/206 |
| 4,173,494 | 11/1979 | Johnson et al. | 136/250 |
| 4,219,926 | 9/1980 | Bloch et al. | 29/832 |
| 4,407,320 | 10/1983 | Levine | 136/250 |
| 4,410,558 | 10/1983 | Izu et al. | 437/2 |
| 4,521,640 | 6/1985 | Levine | 136/250 |
| 4,581,103 | 4/1986 | Levine et al. | 156/659.11 |
| 4,582,588 | 4/1986 | Jensen et al. | 205/124 |
| 4,614,835 | 9/1986 | Carson et al. | 136/250 |
| 4,625,071 | 11/1986 | De Lahoy et al. | 136/250 |
| 4,663,828 | 5/1987 | Hanak | 437/2 |
| 4,691,076 | 9/1987 | Levine et al. | 136/250 |
| 4,806,495 | 2/1989 | Levine et al. | 437/2 |
| 4,872,607 | 10/1989 | Jensen et al. | 228/180.1 |
| 4,888,061 | 12/1989 | Wenz | 136/251 |
| 4,917,752 | 4/1990 | Jensen et al. | 156/292 |
| 4,957,601 | 9/1990 | Levine et al. | 156/645.1 |
| 4,968,372 | 11/1990 | Maass | 156/249 |
| 4,992,138 | 2/1991 | Jensen et al. | 156/644.1 |
| 4,994,878 | 2/1991 | Levine et al. | 136/244 |
| 5,028,546 | 7/1991 | Hotchkiss | 437/2 |
| 5,091,319 | 2/1992 | Hotchkiss et al. | 437/2 |
| 5,092,939 | 3/1992 | Nath et al. | 136/251 |
| 5,192,400 | 3/1993 | Parker et al. | 205/124 |
| 5,232,860 | 8/1993 | Kawanishi et al. | 437/2 |
| 5,278,097 | 1/1994 | Hotchkiss et al. | 437/164 |

FOREIGN PATENT DOCUMENTS

| | | | |
|---|---|---|---|
| 4-107882 | 4/1992 | Japan | 136/259 |
| 4-207085 | 7/1992 | Japan | 136/250 |

*Primary Examiner*—Mark Chapman
*Attorney, Agent, or Firm*—Holme Roberts & Owen

[57] ABSTRACT

Provided is a thin film photovoltaic device and a method of manufacturing the device. The thin film photovoltaic device comprises a film layer having particles which are smaller than about 30 microns in size held in an electrically insulating matrix material to reduce the potential for electrical shorting through the film layer. The film layer may be provided by depositing preformed particles onto a surrogate substrate and binding the particles in a film-forming matrix material to form a flexible sheet with the film layer. The flexible sheet may be separated from the surrogate substrate and cut into flexible strips. A plurality of the flexible strips may be located adjacent to and supported by a common supporting substrate to form a photovoltaic module having a plurality of electrically interconnected photovoltaic cells.

12 Claims, 7 Drawing Sheets

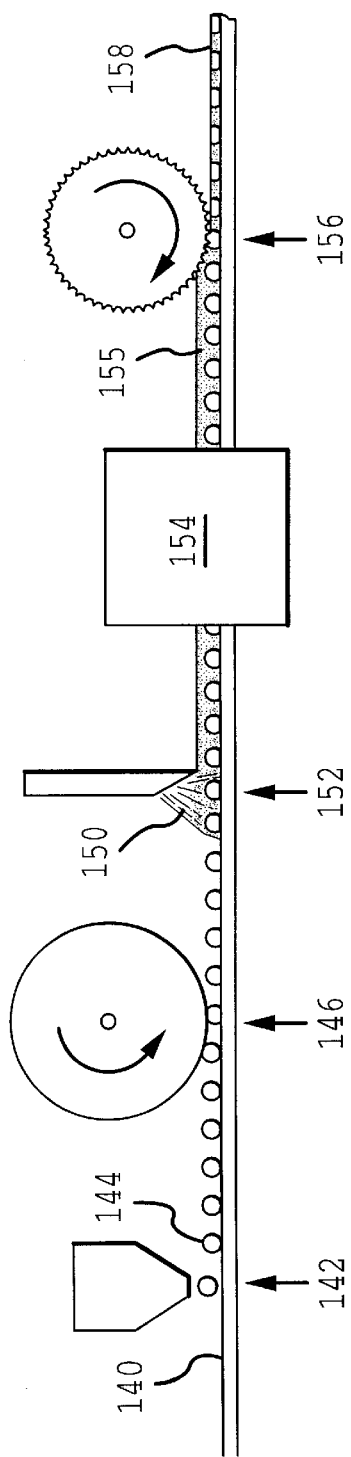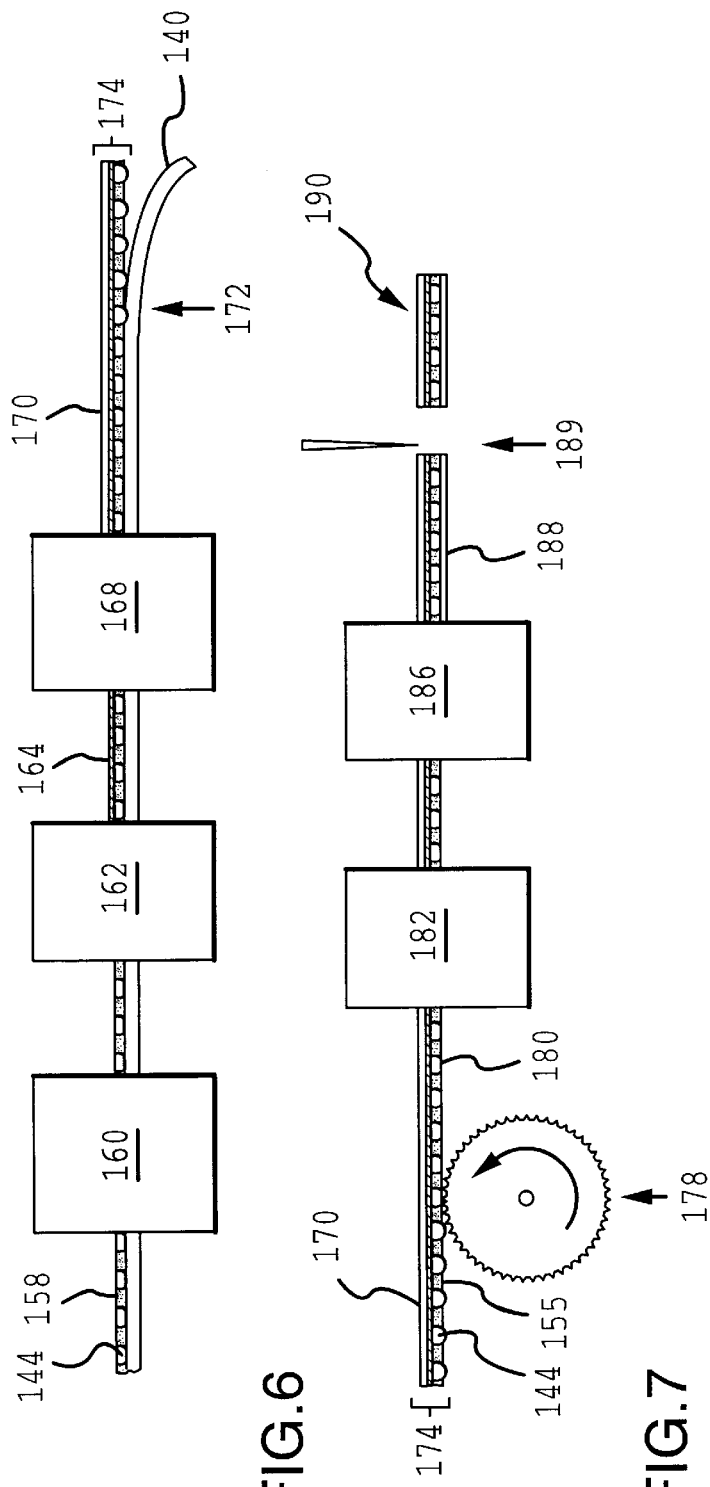

THIN FILM PHOTOVOLTAIC DEVICE AND PROCESS OF MANUFACTURE

This application is a division of application Ser. No. 08/480,452 filed Jun. 7, 1995 which application is now: U.S. Pat. No. 5,674,325.

ACKNOWLEDGEMENT OF GOVERNMENT SUPPORT

This invention was made with Government support under Subcontract No. ZN-0-19019 awarded by the Midwest Research Institute, National Renewable Energy Laboratory Division under Prime Contract No. DE-AC02-83CH10093 awarded by the Department of Energy. The Government has certain rights in this invention.

FIELD OF THE INVENTION

The present invention relates generally to photovoltaic devices and methods of manufacturing the same.

BACKGROUND OF THE INVENTION

Photovoltaic cells have long been considered a possible alternative to nonrenewable energy sources. Most types of photovoltaic cells have a photoactive area (i.e., an area that generates electricity in response to light) that is composed of a semiconductor layer disposed between two electrode layers. The various layers are typically deposited on a flat, rigid supporting substrate, such as glass. A number of electrically interconnected photovoltaic cells may be supported on a common supporting substrate. The combination of the supporting substrate and the photovoltaic cell(s) is typically referred to as a photovoltaic module.

One process for making a photovoltaic module is to sequentially form layers on top of a supporting substrate to build a photoactive area on the supporting substrate. The photoactive area may then be divided into a number of individual photovoltaic cells which may be interconnected in series to boost the voltage output from the photovoltaic module. The photovoltaic cells may then be encapsulated to protect the cells from the external environment during operation of the module. The process of building a photovoltaic module by the sequential formation of layers on a supporting substrate is a common technique for making thin film photovoltaic devices, such as those using thin semiconductor films of cadmium telluride or copper indium diselenide in a power-producing semiconductor layer.

The sequential deposition of layers on a supporting substrate such as glass, however, is expensive. Some deposition steps may require a high temperature, which requires energy to heat the supporting substrate and induces thermal stresses into the supporting substrate which may cause breakage of some substrate materials, such as glass. Also, the processing of glass sheets is cumbersome and not well suited to a high speed operation.

Furthermore, for some thin film semiconductor materials, such as cadmium telluride, the semiconductor material is typically recrystallized following deposition of the semiconductor material to obtain crystals of a suitable size and morphology for use in a photovoltaic cell. Recrystallization tends to be, however, a very slow process and requires a significant amount of energy to heat not only the desired semiconductor film but also the supporting substrate, significantly adding to the expense of the manufacturing process. Additionally, during recrystallization, void spaces tend to form in the semiconductor film, making the semiconductor film more susceptible to electrical shorting through the film.

Another problem encountered with many thin film photovoltaic devices is control over the stoichiometry of the components of the semiconductor material during deposition of semiconductor thin films. For example, maintenance of the stoichiometry of copper indium diselenide during deposition of a thin film can be difficult to control, especially in a high volume industrial setting.

There is a need for an improved process for making photovoltaic devices, and especially for making thin film devices, which is more suitable for high volume production and which reduces the costs associated with processing the supporting substrate.

SUMMARY OF INVENTION

In one aspect of the present invention small, preformed particles of a crystalline semiconductor material are incorporated into thin film photovoltaic cells substantially without the need for recrystallizing the semiconductor material. In another aspect, the present invention provides a method for making photovoltaic devices, and especially thin film devices, in which flexible strips having film layers are prepared which may be used in forming a photovoltaic module. The flexible strips are prepared independent from the final, supporting substrate to be used in the photovoltaic module, thereby reducing the need to process the supporting substrate during the manufacturing process. The expense of heating the supporting substrate during the manufacturing process is significantly reduced.

In one embodiment, the film into which the particles are incorporated has a thickness of smaller than about 30 microns, which may be used in a thin film photovoltaic device. Preferred semiconductor materials for the particles are compound semiconductors useful in thin film devices, such as metal chalcogenides, which have large absorption coefficients and short diffusion lengths. Particularly preferred as semiconductors for use in the particles are cadmium telluride and copper indium diselenide. The particles, which are smaller than about 30 microns in size, are incorporated into a thin film of a photovoltaic cell, which could be used in a photovoltaic module, substantially without altering the bulk crystal morphology of the semiconductor material in the particles. Because the semiconductor material is provided in small, preformed particles having the desired material properties for use in a the photovoltaic device, the need, and expense, for controlling the stoichiometry during deposition of a semiconductor material in a thin film is reduced. This should be particularly beneficial when using copper indium diselenide, the stoichiometry of which is difficult to control during thin film deposition. With the present invention, the semiconductor particles could be preformed in a more controllable environment without the added complexity of simultaneously depositing a thin film. Also, the need to recrystallize the semiconductor material after deposition in a thin film is reduced because the preformed particles used to make a thin film according to the present invention have a bulk crystal morphology suitable for use in the final photovoltaic device. This should be particularly beneficial in making photovoltaic devices having cadmium telluride thin films, which have typically required recrystallization following deposition.

In one embodiment, a flexible sheet, having one or more film layers, is initially formed on a surrogate substrate. The surrogate substrate may be flexible and relatively thin. The need is thereby reduced for processing a large, bulky substrate, such as a sheet of glass, on which photovoltaic cells may ultimately be permanently supported for use.

In another embodiment, preformed particles having a desired semiconductor material in a crystalline form may be embedded in a flexible tape which serves as a surrogate substrate. A film-forming material may then be used to fill spaces on the surrogate substrate between the particles. The film-forming material may be cured to produce a thin film having the semiconductor particles held in a matrix of the cured film-forming material. The film-forming material, after curing, should be electrically non-conducting so that the potential for electrical shorts through the film would be reduced. Additional film layers for the photovoltaic device may be deposited on top of the film-forming material. For example, when using cadmium telluride particles, a heterojunction may be formed on the surrogate substrate between the cadmium telluride particles and a subsequently deposited semiconductor film, such as a film of cadmium sulfide. Eventually, the flexible sheet, having the film layer(s), is separated from the surrogate substrate so that the film layer(s) may be incorporated into a photovoltaic cell to be supported on a permanent, supporting substrate. The flexible sheet may be cut into pieces to permit a plurality of photovoltaic cells to be supported on a common supporting substrate and electrically interconnected to form a photovoltaic module.

In another aspect, the present invention provides a photovoltaic module having photovoltaic cells having a thin film with particles of a semiconductor material in a crystalline form in which spaces in the film between the particles are occupied by an electrically insulating matrix material, such as an electrically insulating polymeric material. Other electrically insulating matrix materials include glass and ceramics. The photovoltaic cells thus have a reduced susceptibility to electrical shorting through the film. This provides a significant benefit relative to current cadmium telluride devices, which are susceptible to shorting through the cadmium telluride film due to the presence of void spaces formed in the film during deposition or recrystallization of the cadmium telluride. In one embodiment, the matrix material comprises a material which is capable of redirecting energy from sunlight striking the matrix material to the semiconductor particles, thereby reducing the loss to power production due to sunlight striking the matrix material rather than a particle.

BRIEF DESCRIPTION OF THE DRAWINGS

FIGS. 5–7 show a process flow schematic of one embodiment of the present invention for making flexible strips which could be used in a photovoltaic device;

DETAILED DESCRIPTION

The present invention provides a photovoltaic device and a method for making the photovoltaic device that is adaptable to use of a high speed, roll-to-roll operation for forming film layers, such as may be performed on a printing press or similar apparatus. An important aspect of the present invention is the construction of film layers for photovoltaic cells on a flexible, surrogate substrate before the layers are located on top of a final, supporting substrate. This process simplifies not only formation of the film layers and the resulting photovoltaic cells, but also division and interconnection of photovoltaic cells on the supporting substrate. Another important aspect of the present invention is that small, preformed particles having a semiconductor material in crystalline form may be incorporated into a film layer, substantially without altering the bulk crystal morphology of the semiconductor material following deposition of the film.

Figure 1:
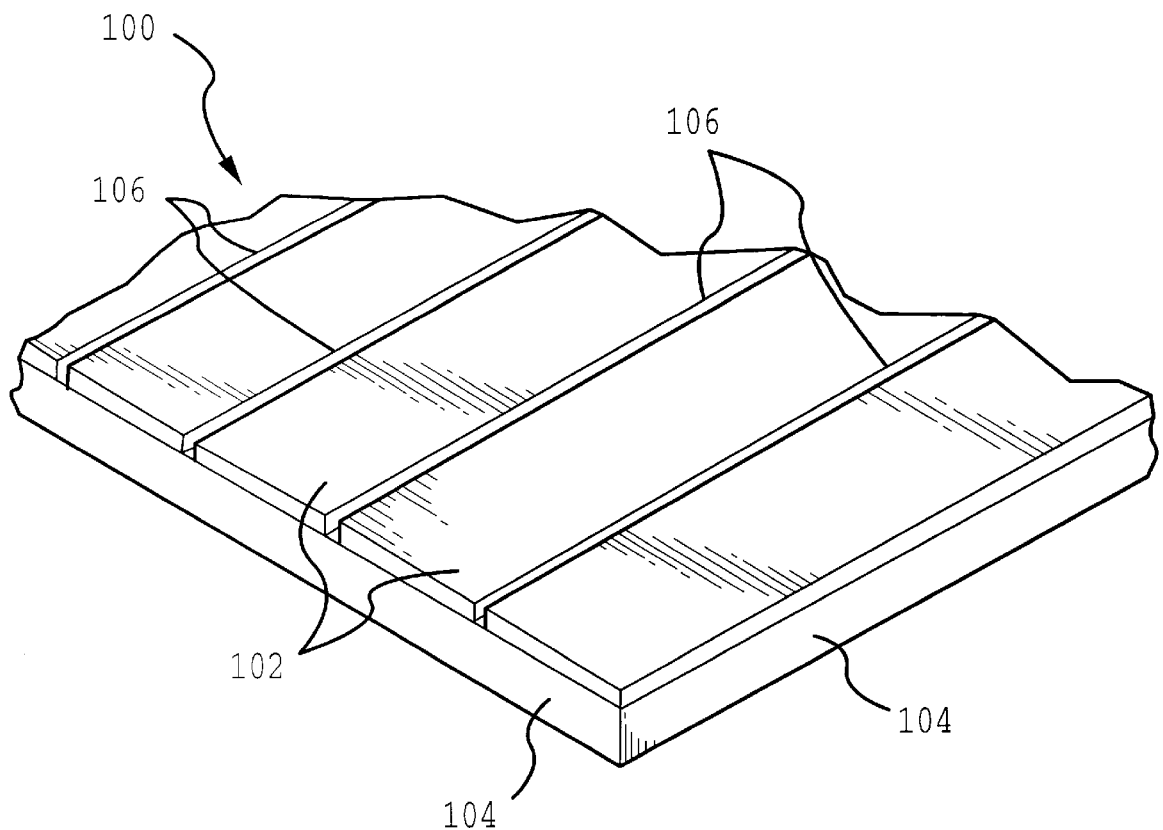
FIG. 1 is a partial perspective view of one embodiment of an unencapsulated photovoltaic module of the present invention having a plurality of electrically interconnected photovoltaic cells supported on a common supporting substrate.

FIG. 1 shows a partial view of one of the embodiments of a photovoltaic module 100 of the present invention which has a plurality of photovoltaic cells 102 supported on a supporting substrate 104. The photovoltaic cells 102 are electrically interconnected in series across interconnection regions 106 to boost the total voltage of the photovoltaic module.

The supporting substrate 100 is typically made of a rigid material to provide structural support to and protection of the photovoltaic cells 102 during use. A sheet of glass is a preferred supporting substrate 104. Although not shown, the photovoltaic cells, may be encapsulated by any suitable encapsulating structure to protect them for the external environment during operation. One encapsulation structure is disclosed in co-pending U.S. patent application Ser. No. 08/095,381 now U.S. Pat. No. 5,460,660, the contents of which are incorporated herein by reference in their entirety.

Figure 2:
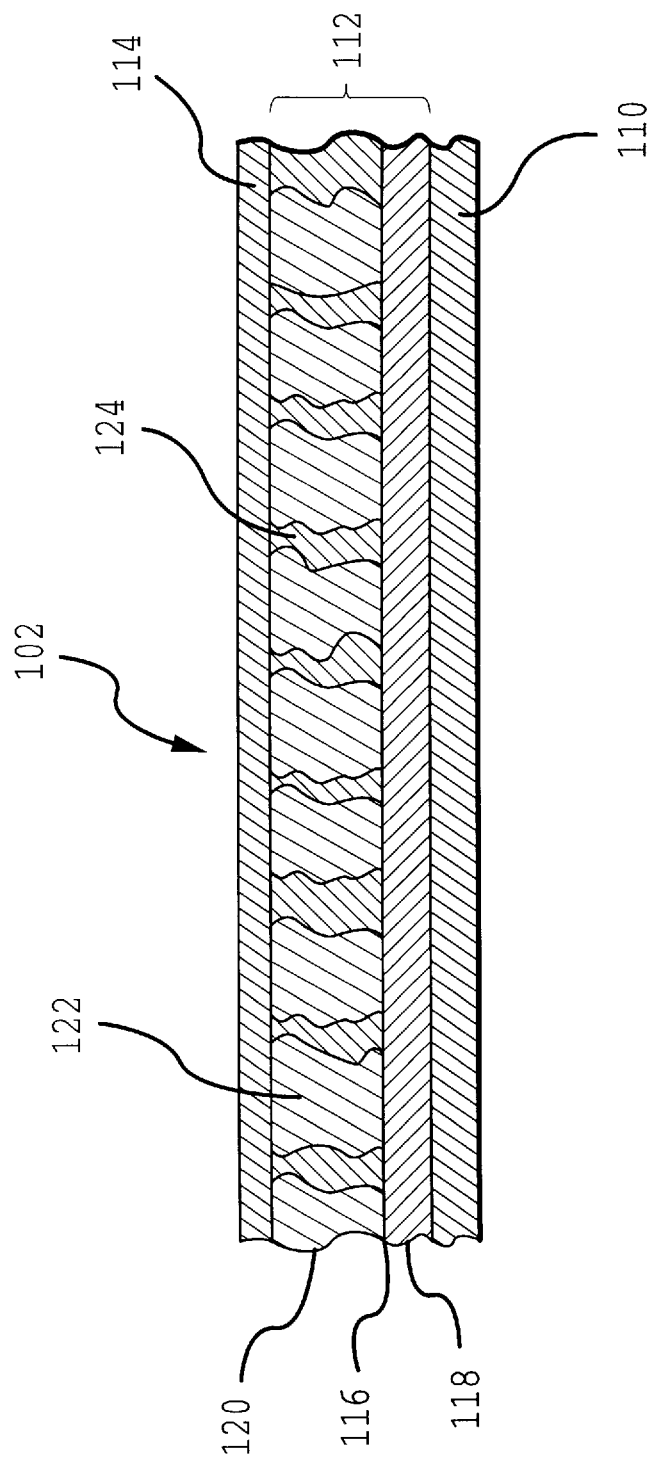
FIG. 2 shows a partial cross-section of one embodiment of a photovoltaic cell of to the present invention.

With reference to FIG. 2, one embodiment of a photovoltaic cell 102 of the present invention is shown. The photovoltaic cell 102 has a first electrode film 110, a semiconductor layer 112 and a second electrode film 114. The semiconductor layer 112 is capable of generating electrical power in response to sunlight and is electrically interconnected with both the first electrode film 110 and the second electrode film 114. The first electrode film 110 is in electrical contact with one side of the semiconductor layer 112 and the second electrode film 114 is in electrical contact with the other side of the semiconductor layer 112. During operation, if an external electrical load is connected to the photovoltaic cell 102, electrical current could flow between the first electrode film 110 and the second electrode film 114.

The semiconductor layer shown 112 in FIG. 2 comprises a heterojunction 116 between a first semiconductor film 118 and a second semiconductor film 120. The second semiconductor film 120 is a thin film, having a width of smaller than about 30 microns, and includes a plurality of particles 122 comprising a second semiconductor material. Spaces between the particles 122 are substantially filled with a matrix material 124 which is substantially electrically insulating. The matrix material 124 substantially reduces the potential for defects in the second semiconductor film 120 which could cause electrical shorting.

The second semiconductor material is in a crystalline form in the particles 122. Although each particle may comprise multiple crystal grains, it is preferred that each particle 122 comprise a single crystal grain. The crystals of second semiconductor materials in the particles 122 have a morphology which is suitable for photovoltaic power generation. The second semiconductor material is preferably a compound semiconductor and is more preferably a metal chalcogenide selected from the group consisting of a metal sulfide, metal selenide and metal telluride, such as are often used in thin film photovoltaic devices. Also, the second semiconductor material preferably has a high absorption coefficient suitable for use as an absorber-generator layer in a thin film photovoltaic cell. The absorption coefficient is preferably larger than about $1 \times 10^3$/cm and more preferably larger than about $1 \times 10^4$/cm. These materials, and particularly cadmium telluride and copper indium diselenide, are preferred because they can absorb essentially all incident sunlight in a very thin layer. These materials also typically have a very short diffusion length, being less than about five microns and more preferably less than about one micron. The metal may be a single metal or a mixed metal, such as when the semiconductor material comprises copper indium diselenide. Representative metals include copper, cadmium, indium gallium, zinc, mercury, lead and combinations of the foregoing. Examples of second semiconductor materials include cadmium telluride, copper sulfide, copper indium disulfide, and copper indium diselenide. Preferred metal chalcogenides are Group II-VI semiconductors (such as cadmium telluride) and Group I-III-VI semiconductors (such as copper indium diselenide), and particularly those with a band gap of from about 1 to about 2 eV. Cadmium telluride and copper indium diselenide are particularly preferred as second semiconductor materials.

The first semiconductor film 118 comprises a first semiconductor material, which is different than the second semiconductor material. Also, the first semiconductor film has different electrical properties than the first semiconductor material, so as to form the power-producing heterojunction 116 at interfaces between the particles 122 and the first semiconductor film 118. In one preferred embodiment, the first semiconductor film 118 is n-type, preferably comprising cadmium sulfide, and the second semiconductor film is p-type, preferably comprising at least one of cadmium telluride and copper indium diselenide, with cadmium telluride being more preferred. In this preferred embodiment, the photovoltaic cell 102 would typically be a backwall design, with sunlight passing through the first electrode film 110 and the first semiconductor film 118 prior to being absorbed for power generation in the second semiconductor film 120. The photovoltaic cell 102 could, however, also be of a frontwall design without deviating from the scope of the present invention.

The particles 122, and consequently the second semiconductor film 120, are smaller than about 30 microns in size, preferably smaller than about 20 microns in size and most preferably smaller than about 10 microns in size. The particles 122 should, however, be large enough to assure essentially complete absorption of available sunlight. The particles 122 for preferred second semiconductor materials, such as cadmium telluride and copper indium diselenide should, therefore, preferably be larger than about 1.5 microns and more preferably larger than about 2 microns. Particularly preferred are particles 122 are of a size of from about 2 microns to about 10 microns. The particles 122 also preferably have a relatively narrow size distribution, such that the particles 122 are of a relatively uniform size.

The matrix material may be any material which provides for electrical insulation in the spaces between the particles 122. The matrix material preferably has a resistivity of larger than about 15 mega ohm-centimeters. Preferred materials for the matrix material 124 include electrically insulating polymeric materials such as polyimides, polystyrenes, acrylic resins and polyurethanes. Sunlight striking the matrix material 124, and not striking the particles 122, represents a loss of power generation capacity. The matrix material 124 may, therefore, include a component or components which could redirect to the particles 122 at least a portion of the energy of sunlight striking the matrix material 124. In one embodiment, a light reflecting, refracting or diffusing component could be included in the matrix material 124 to redirect some of the sunlight to the particles 122. Such components include titanium dioxide, glass and metals such as aluminum. In another embodiment, a fluorescent component, such as fluorescein or a zinc sulfide phosphor, could be included in the matrix material 124. During operation of the photovoltaic cell 102, at least some of the fluorescent emission from the fluorescent component would be directed to the particles 122 to supply additional energy for power production. These energy-redirecting components which could be included in the matrix material 124 may be in the form of very small particles, typically smaller than about 0.1 microns. Alternatively, the energy-redirecting component could be present in a homogeneous mixture in the matrix material 124.

The first electrode film 110 and the second electrode film 114 may be made of any suitable electrode materials which have a high electrical conductivity. The electrode film through which sunlight passes to reach the semiconductor layer 112 should be optically transmissive, or transparent to sunlight. This will be the first electrode film 110 when the photovoltaic cell 102 has a backwall design. Transparent electrode materials include transparent conducting oxides such as tin oxide, indium oxide, indium tin oxide and cadmium stannate. A very thin layer of gold, or another suitable metal such as nickel or chromium, could also be used as a transparent electrode film. When gold is used as a transparent electrode film, the film should preferably be thinner than about 500 angstroms. The electrode film opposite the sun, which would be the second electrode film 114 in a backwall cell configuration, does not need to be transparent and normally comprises a conductive metal, such as tin, nickel or chromium. A preferred design for the photovoltaic cell 102 is a backwall design having gold as a first electrode film, n-type cadmium sulfide as a first semiconductor film 118, p-type cadmium telluride or p-type copper indium diselenide as the second semiconductor film 120, and tin, nickel or chromium for the second electrode film 114. Although the description of the present invention primarily refers to backwall configurations for the photovoltaic cell 102, the same principles apply equally to frontwall configurations making the necessary adjustments to accommodate the frontwall design.

Figure 3:
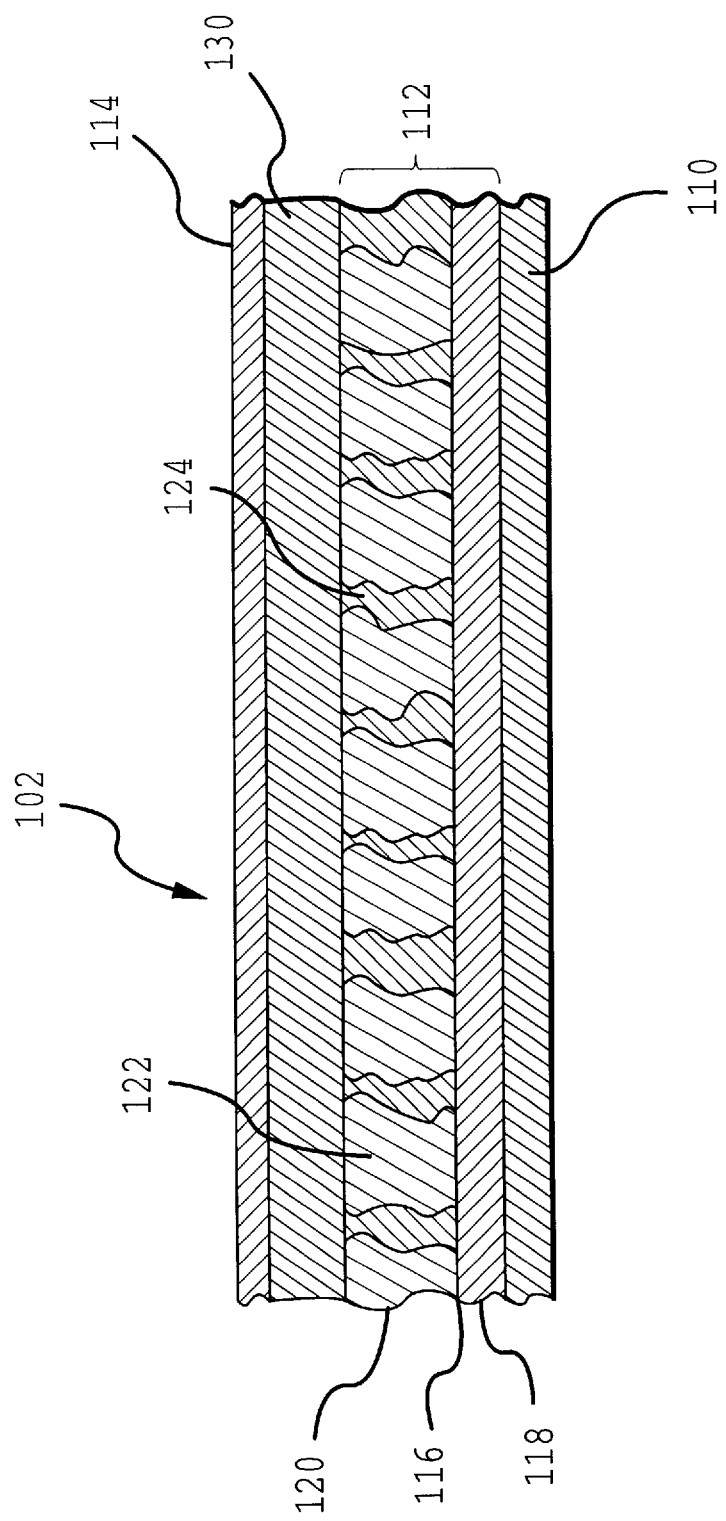
FIG. 3 shows a partial cross-section of another embodiment of a photovoltaic cell of the present invention.

Although only four film layers are shown in the photovoltaic cell 102 in FIG. 2, additional film layers may be included in the photovoltaic cell 102, if desired. For example, FIG. 3 shows one embodiment of the photovoltaic cell 102, which is the same as shown in FIG. 2 except that the photovoltaic cell 102 includes an ohmic contact film 130 interposed between the second semiconductor film 120 and the second electrode film layer 114. In the case of p-type cadmium telluride for the particles 122, an ohmic contact film layer 130 of graphite may be used to improve the ohmicity of the electrical contact between the second semiconductor film 120 and the second electrode film layer 114. Other materials which may be used in the ohmic contact layer include tellurium and appropriate compound semiconductors such as zinc telluride and mercury telluride. These materials may be doped to provide the desired electrical properties.

Figure 4:
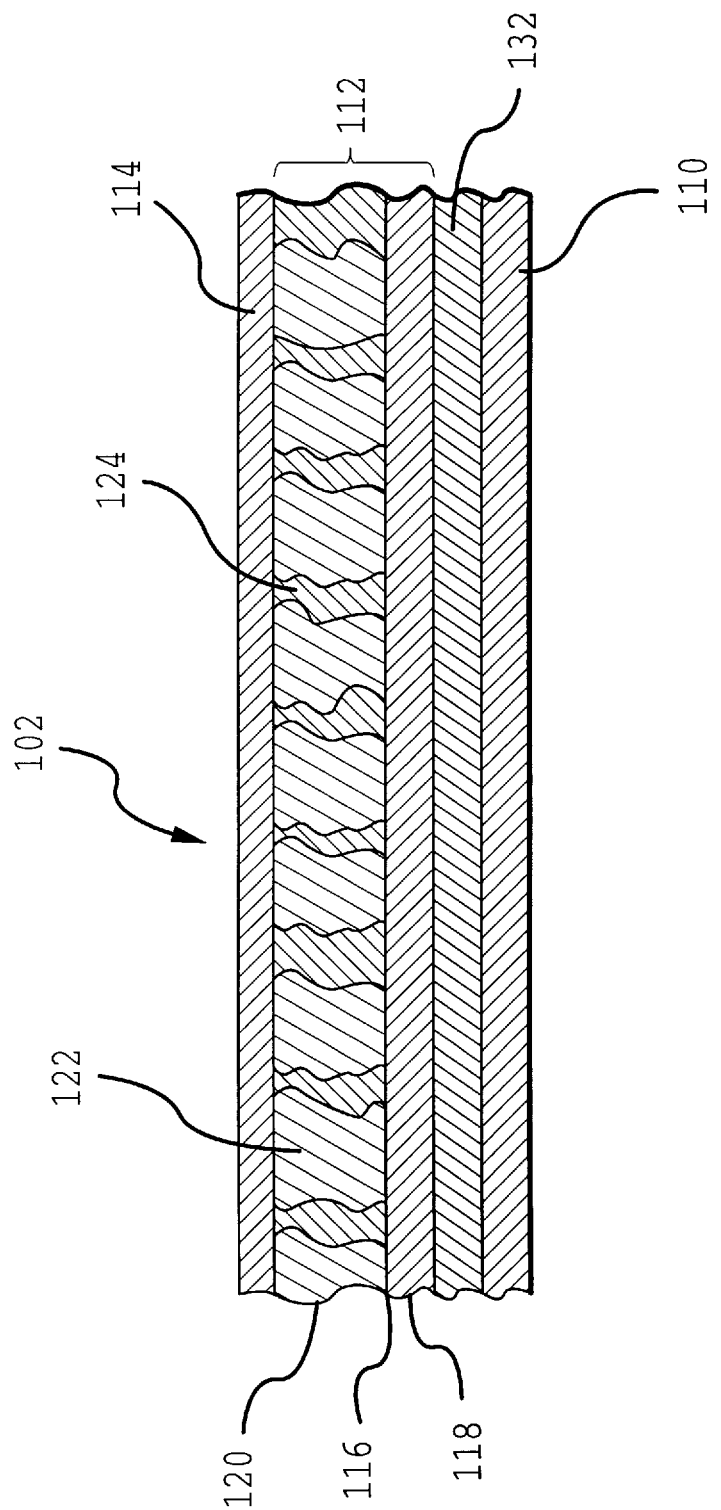
FIG. 4 shows a partial cross-section of yet another embodiment of a photovoltaic cell of the present invention.

In another embodiment, as shown in FIG. 4, the photovoltaic cell 102 may include a protective film 132 to provide a barrier to electrical shorts across defects which may occur in the first semiconductor film 118 and to improve structural and electrical interconnection of the first electrode film 110 and the first semiconductor film 118. The protective film 132 preferably has no significant resistance to current flow across the width of the protective film 132 so as to facilitate free current flow between the first semiconductor film 118 and the first electrode film 110 and a high resistance to current flow laterally across the protective film. One preferred protective film 132 is a Z-direction conductive tape such as Products Nos. 9703 and 5303R of the 3M Corporation. The Z-direction conductive tape is a tape having an electrically insulating polymer-based matrix with small conductive metallic particles dispersed in the matrix and providing a highly conductive electrical path across the width of the tape. The tape is however, substantially electrically non-conductive in a lateral direction along the tape.

Referring now to FIGS. 5–7, one embodiment of a method for making a photovoltaic device of the present invention will be described. Referring first to FIG. 5, a flexible, surrogate substrate 140 is provided having an adhesive on at least one side. The adhesive is preferably a low tack adhesive which is pressure sensitive. The surrogate substrate 140 must be sufficiently flexible and must provide sufficient structural support to permit roll to roll processing of the surrogate substrate during formation of thin films on the surrogate substrate 140 for use in a photovoltaic device. The surrogate substrate 140 may be made of any flexible materials which could include metals, cloths, plastics, etc. One preferred surrogate substrate 140 is a flexible plastic tape, such as an acetate tape.

In a particle deposition step 142, particles 144 are deposited onto a side of the surrogate substrate 140 having the adhesive. The particles 144 may be deposited on the surrogate substrate 140 in any suitable manner, such as by feeding the particles through a hopper with a feed rate regulated to coincide with the speed at which the surrogate substrate is traveling. The particles 144 comprise a crystalline semiconductor material having a bulk crystal morphology. The semiconductor material preferably comprises a compound semiconductor, and more preferably a metal chalcogenide selected from the group consisting of a metal sulfide, metal selenide and metal telluride. Even more preferably, the semiconductor material comprises at least one of cadmium telluride and copper indium diselenide. Also, the particles 144 are of a size suitable for use in a thin film photovoltaic cell. The particles 144 should be smaller than about 30 microns in size, more preferably smaller than about 20 microns in size and even more preferably smaller than about 10 microns in size. Particularly preferred are particles of from about 2 microns in size to about 10 microns in size.

After the particle deposition step 142, the particles 144 are embedded into the surrogate substrate 140 in an embedding step 146. The embedding step 146 may be accomplished, for example, by pressing the particles 144 into the surrogate substrate 140 with a roller. Preferably, greater than about 10% of the surface area of the particles 144 are in contact with the adhesive on the surrogate substrate 140 following the embedding step 146. More preferably, greater than about 20% of the surface area of the particles 144 are in contact with the adhesive.

After the embedding step 146, a film-forming material 150 is applied to the surrogate substrate 140 to fill spaces which may exist between the particles 144 in a film-forming material 150 deposition step 152. The film-forming material 150 may be deposited in any suitable manner, such as by using a doctor blade by spraying, by dipping or by curtain coating. The film-forming material 150 deposited on the surrogate substrate 140 is preferably deposited to a depth of smaller than about 120% of the mean diameter of the particles 144, and more preferably to a depth of from about 90% to about 110% of the mean particle diameter. Preferably, the film-forming material 150 should have a material which is electrically insulating so that electrical shorts around the particles 144 may be avoided in a final photovoltaic device. Suitable materials for the film-forming material include polyamides, polystyrenes, acrylic resins and polyurethanes. The film-forming material 150 may also comprise one or more components for redirecting energy of sunlight to the particles 144 in a photovoltaic device, as previously described with reference to FIGS. 2–4. Additionally, it should be noted that as an alternative to separately depositing the particles 144 and the film-forming material 150, the particles 144 and the film-forming material 150 could be premixed and deposited as a mixture prior to the embedding step 146. In the case of such premixing, the surrogate substrate 140 may be used without an adhesive because it will not be necessary to adhere the particles 144 to the surrogate substrate 144, as previously discussed.

After the film-forming material deposition step 152, the film-forming material 150 is cured in a curing step 154 to impart structural strength to the film-forming material so that it binds and holds the particles 144 in a solid, flexible matrix 155 of the cured film-forming material. During the curing step 154, the film-forming material 150 is generally subjected to a heat treatment to drive off any volatile solvents and to thermally and/or chemically cross-link the film-forming material to provide the desired structural properties for the matrix 155. The heating temperature will depend upon the particular film-forming material used. For example, when using a polyurethane as a film-forming material, a curing temperature of from about 100° C. to about 140° C. should be used.

After the curing step 154, at least a portion of the matrix 155 and the particles 144 are removed in a first removal step 156. During the first removal step 156, a surface portion of the matrix 155 and the particles 144 is removed so that substantially planar surfaces 158 of the particles 144 are exposed. The first removal step 156 may be performed using any suitable abrading method, such as using a free grit of abrasion particles or a grit of abrasion particles fixed on a suitable support, such as on a rotating wheel, travelling belt or sliding plate. Preferably, abrasion particles are smaller than about 400 grit.

Referring now to FIG. 6, after the first removal step 156, the exposed surfaces 158 of the particles 144 are subjected to a first surface treatment step 160 in which the surfaces 158 are treated to cleanse the surfaces 158 of the particles 144 and to prepare the surfaces 158 for deposition of a film over the surfaces 158. In the first surface treatment step 160, oxides and debris which may be present on the surfaces 158 of the particles 144 are removed. A treating fluid may be used which removes such oxides and debris. Preferred treating fluids include high viscosity alcohols including isobutyl alcohol, propylene glycol and glycerine, which preferably have a material such as ammonium bifluoride, potassium cyanide or hydrogen fluoride in solution. The treating fluid may be removed from the surfaces 158 of the particles 144 by washing with deionized water, followed by drying. Alternative to, or in addition to, treatment with the relatively mild treating fluid, the surfaces 158 may be treated with a strong etchant, such as bromine dissolved in methanol or a mixture containing hydrofluoric acid and phosphoric acid. The etchant may remove surface irregularities remaining on the surfaces 158 after the first removal step 156. When such an etchant is used, it is preferably followed by treatment with the relatively mild treating fluid.

After the first surface treatment step 160, there is a semiconductor film deposition step 162 in which a semiconductor film 164 is deposited over and contacts with the surfaces 158 of the particles 144. The semiconductor film 164 comprises a semiconductor material which is different than the semiconductor material of the particles 144, so that the semiconductor film preferably forms a heterojunction with the semiconductor materials of the particles 144. When the semiconductor material in the particles 144 comprises cadmium telluride or copper indium diselenide, the second semiconductor material is typically cadmium sulfide. The semiconductor film 164 may be deposited by any suitable means such as by chemical vapor deposition, vacuum evaporation (including close spaced sublimation), and solution growth. Preferably, the deposition temperature is lower than about 360° C. to avoid damage to either the surrogate substrate 140 or the bulk crystal morphology of the particles 144.

After the semiconductor film deposition step 162, a first electrode film 170 is deposited in a first electrode film deposition step 168. The first electrode film 170 should be optically transmissive for a backwall photovoltaic cell configuration and is preferably a thin metallic layer, such as a thin layer of gold. When using gold, the first electrode film 170 should have a film thickness of smaller than about 500 angstroms. The first electrode film 170 may be deposited in the first electrode film deposition step 168 by any suitable technique such as by vacuum evaporation.

After the first electrode deposition step 168, the surrogate substrate 140 is separated, in a separation step 172, from the other layers, which form a flexible sheet 174. In some instances, it may be possible to separate the surrogate substrate 140 from the flexible sheet 174 by the use of applying a mechanical shock, vibration or flexure to the surrogate substrate 140 to cause it to dislodge from the flexible sheet 174. Alternatively, a separation blade or other mechanical device could be used to peel away the surrogate substrate 140 from the flexible sheet 174. The surrogate substrate 140, which has been separated from the flexible sheet 174, may be collected on a separate roll for storage prior to disposal or possible recycling of the surrogate substrate 140, if appropriate. The flexible sheet 174 is further processed.

Referring now to FIG. 7, after the separation step 172, the flexible sheet 174 is subjected to a second removal step 178, similar to the first removal step 146, to remove a portion of the particles 144 from the side of the flexible sheet 174 which is opposite the first electrode film 170 so that substantially planar, exposed surfaces 180 of the particles 144 are formed. In one embodiment, however, the second removal step may be eliminated, if desired. This may be the case when an ohmic contact layer, such as a graphite layer, is included in the photovoltaic device. If the second removal step 178 is eliminated, however, then it is important that the particles 144 project sufficiently out of the matrix 155 to permit physical and electrical contact between the particles 144 with a subsequently deposited film, such as an ohmic contact film.

After the second removal step 178, the surfaces 180 of the particles 144 are subjected to a second surface treatment step 182, which i. similar to the first surface treatment step 160. During the second surface treatment, the surfaces 180 are cleansed of oxides and debris to prepare the surfaces 180 for subsequent film deposition. The second surface treatment step may comprise treating the surfaces 158 with a treating fluid and/or an etchant, as previously described.

After the second surface treatment step 182, a second electrode film 188 is added to the flexible sheet 174 by deposition over the surfaces 180 of the particles 144 in a second electrode deposition step 186. The second electrode film 188 may be made of any suitable electrically conductive material. For a backwall cell design, the second electrode film 188 is typically a conductive metal, such as a tin, chromium, nickel, or other noble metals. The second electrode film 188 may be deposited by any suitable technique, such as by vacuum evaporation.

After the second electrode deposition step 186, the flexible sheet 174 is cut into separate pieces in the form of flexible strips 190 in a cutting step 189. Each flexible strip 190 comprises a photovoltaic cell substantially as described with respect to FIG. 2. It should be recognized, however, that it is not necessary for all of the film layers of a photovoltaic cell to be a part of the flexible strip 190. One or more film layers could be omitted from the flexible strip 190 and the omitted film layer or layers could be separately provided and combined with the flexible strip 190 to form a complete photovoltaic cell. Furthermore, the flexible strip 190 could be made to comprise additional or different film layers than those which have been described with reference to FIGS. 5–7, so long as the flexible strip 190 includes at least the particles 144 in the matrix 155. For example, an ohmic contact film could be included between the film having the particles 144 in the matrix 155 and the second electrode film 188. This ohmic contact layer could comprise graphite deposited by roller coating directly over the surfaces 180 of the particles 144 prior to deposition of the second electrode film 188. The graphite could contain a dopant, such as copper, which could be diffused into the particles 144 by heat treatment to improve the ohmicity of the electrical contact between the particles 144 and the second electrode film 188. Materials other than graphite may be used or the ohmic contact layer, as previously disclosed. Having such an ohmic contact film is particularly useful when the particles 144 comprise cadmium telluride as a semiconductor material.

Also, deposition of the semiconductor film 164 may be avoided by using particles 144, which when deposited, have a first semiconductor material in the interior of the particles 144 and a thin coating of a second semiconductor material at an exposed surface of the particles 144, with the two semiconductor materials forming a heterojunction. Such particles could be made, for example, by exposing cadmium telluride particles to a gaseous hydrogen sulfide environment to convert a portion of the cadmium telluride in the surface region to cadmium sulfide. In such a case, the second removal step 178 would not be used and a second electrode film could be deposited directly on the surfaces 158 after the first surface treatment step 160, with or without an ohmic contact interlayer. After removal of the sacrificial substrate in the separation step 172, a first electrode film could then be deposited over exposed surfaces of particles 144 to complete a photovoltaic cell.

Another alternative to depositing the semiconductor film 164 would be to instead convert a first semiconductor material in the particles 144 adjacent to the surfaces 158, following the first surface treatment step 160, to a second semiconductor material. For example, when the particles 144 comprise cadmium telluride, the exposed surfaces 158 of the particles 144 could be subjected to gaseous hydrogen sulfide to convert a surface portion of the cadmium telluride to cadmium sulfide. The cadmium telluride and cadmium sulfide would then form the desired heterojunction. In such a surface treatment, however, it should be recognized that the bulk crystal morphology of the cadmium telluride in the particles 144 should be substantially unaffected. As used herein, bulk crystal morphology refers to the crystal morphology of the crystalline semiconductor material in the interior portion of the particles 144. For absorber-generator semiconductor materials such as cadmium telluride, therefore, the bulk crystal morphology is the morphology of the crystalline cadmium telluride which will be responsible for absorbing sunlight for power generation during operation of a photovoltaic device. It should be recognized that alterations of crystal morphology in the surface regions of the particles 144 do not affect the bulk crystal morphology, which is substantially retained throughout the process of the present invention. No recrystallization of the semiconductor material in the particles 144 occurs according to the present invention. Defect chemistry changes may, however, occur. For example, cadmium vacancies in a cadmium telluride film could move or readjust due to processing, treatment or relaxation over time.

The particles 144, of the desired size, may be obtained by comminuting large crystalline chunks which are commercially available in bulk. Comminution may involve, for example dry or wet grinding or milling. Preferably, a narrow size distribution of the particles 144 is obtained by sieving or otherwise classifying the particles 144. Preferably, substantially all of the particles 144 are smaller than about 50% larger than the mean particle diameter of the particles 144. More preferably, substantially all of the particles 144 are from about 50% smaller to about 50% larger than the mean particle diameter.

In one embodiment, once the particles 144 having the desired size have been obtained, the particles 144 are subjected to a first prs-treatment prior to incorporation into the flexible sheet 174. During the pre-treatment, the properties of the semiconductor material in the particles 144 are levelized, so that all of the particles 144 have substantially the same properties throughout each particle and the oxide level of the particles is significantly reduced or adjusted. Such first pre-treatment typically involves heating the particles in a reducing atmosphere, such as in an atmosphere of hydrogen gas, at a temperature above about 500° C., to drive off oxygen which may be present as an oxide on the particles 144 and to levelize the composition of the particles 144 such as by driving off any excess of residual material. Such a first pre-treatment is particularly preferred when using cadmium telluride as the semiconductor material in the particles 144.

A second pre-treatment of the particles 144 may also be performed prior to incorporating the particles 144 into the flexible sheet 174. This second pre-treatment may be performed independent of or in addition to the first pre-treatment. When used with the first pre-treatment, the first pre-treatment should precede the second pre-treatment. The second pre-treatment comprises subjecting the particles 144 to oxygen gas in an oxidizing environment at a temperature of from about 300° C. to about 500° C. for a short period of time in order to oxidize impurities which may be present in the particles to passivate the impurities.

Following the manufacture of the flexible strips 190, a plurality of the flexible strips 190 may be located adjacent to a supporting substrate and used to form a photovoltaic module having a plurality of photovoltaic cells commonly supported by the supporting substrate. The photovoltaic cells may be electrically interconnected, preferably in series, on the common supporting substrate.

Figure 8:
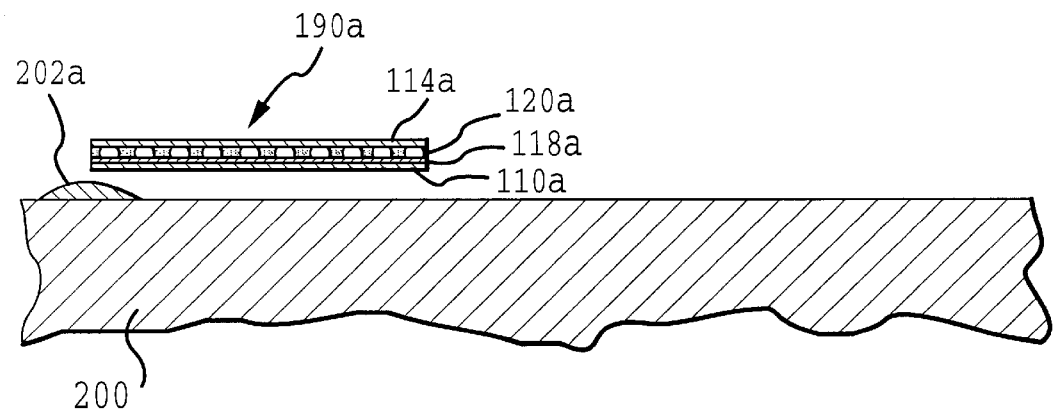
FIGS. 8–10 show in partial cross-section a photovoltaic module in various stages of manufacture according to one embodiment of the present invention.
Figure 9:
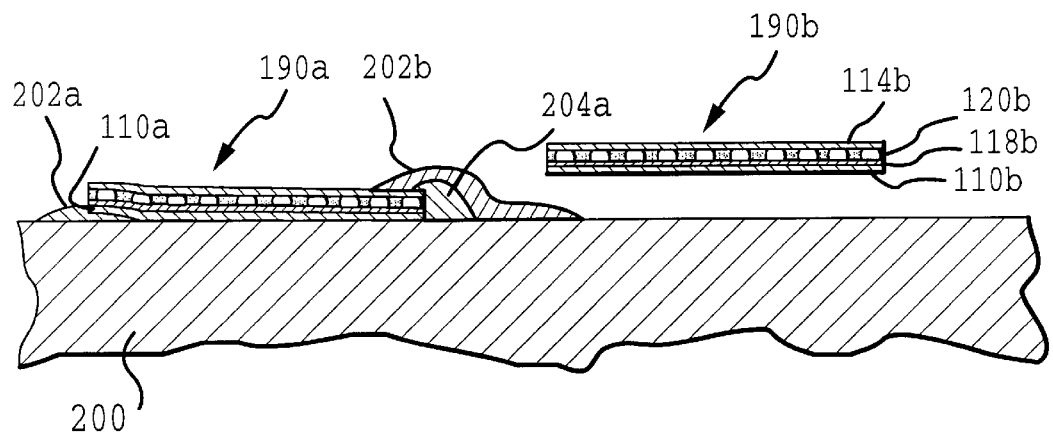
Figure 10:
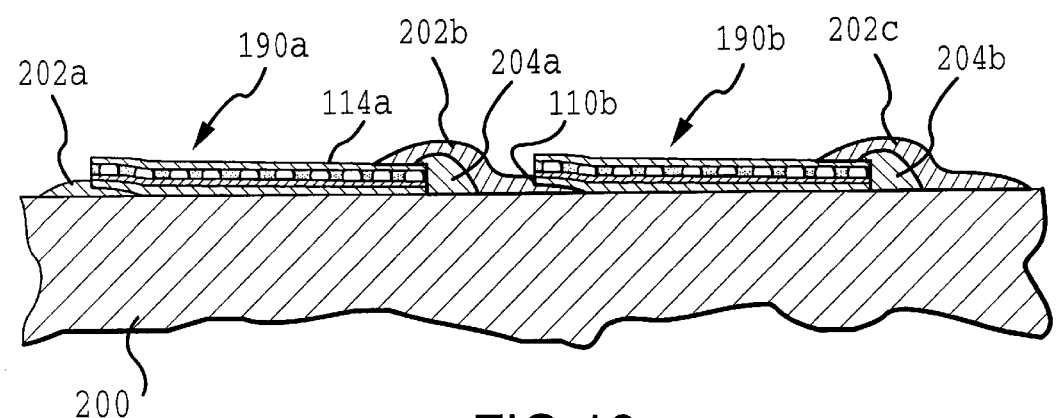

Referring to FIGS. 8–10, one embodiment is shown for locating a plurality of flexible strips 190, having a photovoltaic cell configuration as shown in FIG. 2, on a supporting substrate 200, such as a sheet of glass, to form a photovoltaic module having a plurality of photovoltaic cells. Referring first to FIG. 8, a first bead 202a of electrically conductive paste is placed across the supporting substrate 200 and a first flexible strip 190a is positioned to overlap the first bead 202a of electrically conductive paste. The first flexible strip 190a comprises a first electrode film 110a, a first semiconductor film 118a, a second semiconductor film 120a and a second electrode film 114a. The first flexible strip 190a is positioned with the first electrode film 110a facing the supporting substrate 200. The electrically conductive paste of the first bead 202a may comprise any suitable electrically conductive material such as in a viscous slurry form, such as a copper or nickel paste or a copper epoxy. The first bead 202a may be deposited on the supporting substrate 200 by any suitable means, such as by deposition in a line across the supporting substrate 200 from a small diameter tube or needle or by offset printing.

Referring now to FIG. 9, the first flexible strip 190a is pressed into the first bead 202a to form an electrical contact between the first bead 202a and the first electrode film 110a of the first flexible strip 190a. The first bead 202a may then be cured to remove any volatile material and to structurally set the conductive material of the first bead 202a. Such curing typically involves heating of the bead 202a to an elevated temperature. Alternatively, the curing may be postponed until after a plurality of flexible strips 190 have been located on the supporting substrate 200.

Also as seen in FIG. 9, a first strip 204a of electrically insulating material is deposited over an edge of the first flexible strip 190a opposite from the first bead 202a. Such a first strip 204a could comprise any composition having a suitable electrically insulating material. One useful composition for preparing the first strip 204a is a slurry of titanium dioxide with a binder, such as ethyl cellulose, in a carrier liquid, such as hexanol. The first strip 204a could then be cured in a subsequent heating step, either independent of or simultaneous with curing of the first bead 202a. On top of the first strip 204a is deposited a second bead 202b of the electrically conductive paste and a second flexible strip 190b is located to overlap the second bead 102b.

Referring now to FIG. 10, the second flexible strip 190b is shown pressed into the second bead 202b such that the second electrode film 114a of the first flexible strip 190a, is in series electrical interconnection with the first electrode film 110b of the second flexible strip 190b. Also shown in FIG. 10 is a second strip 204b of the electrically insulating material and a third bead 202c of the electrically conductive material prepared to accept another flexible strip 190 for electrical interconnection. Any number of flexible strips 190 may thus be located and electrically interconnected in series on the common supporting substrate 200 to provide a photovoltaic module having a desired number of electrically interconnected photovoltaic cells. The first and last photovoltaic cells in series could be connected to electrical busses to facilitate removal of current from the photovoltaic module during operation and to distribute current into the photovoltaic module during operation.

The plurality of interconnected photovoltaic cells supported on the base substrate 200 may be encapsulated on the supporting substrate 200 to protect the photovoltaic cells from the external environment. Any suitable encapsulation technique may be used such as that disclosed in co-pending U.S. patent application Ser. No. 08/095,381 now U.S. Pat. No. 5,460.660.

Figure 11:
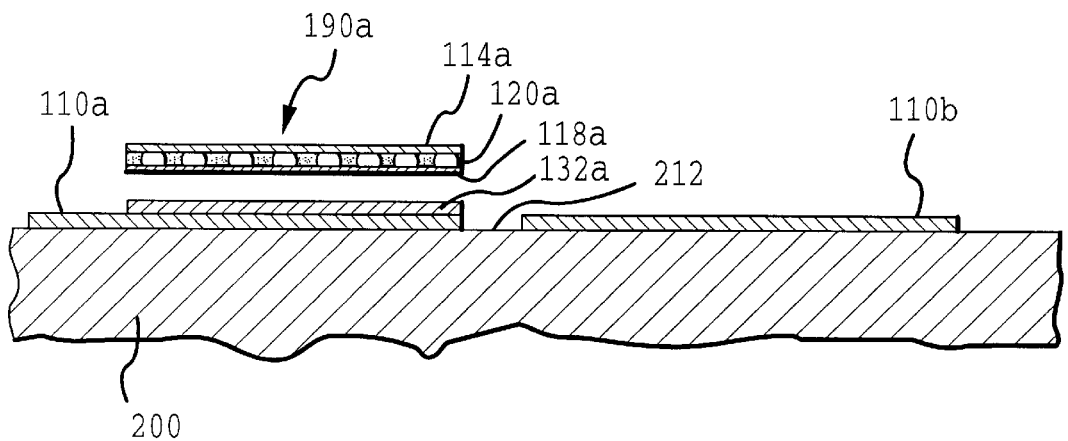
FIGS. 11–13 show in partial cross-section a photovoltaic module in various stages of manufacture according to another embodiment of the present invention.
Figure 12:
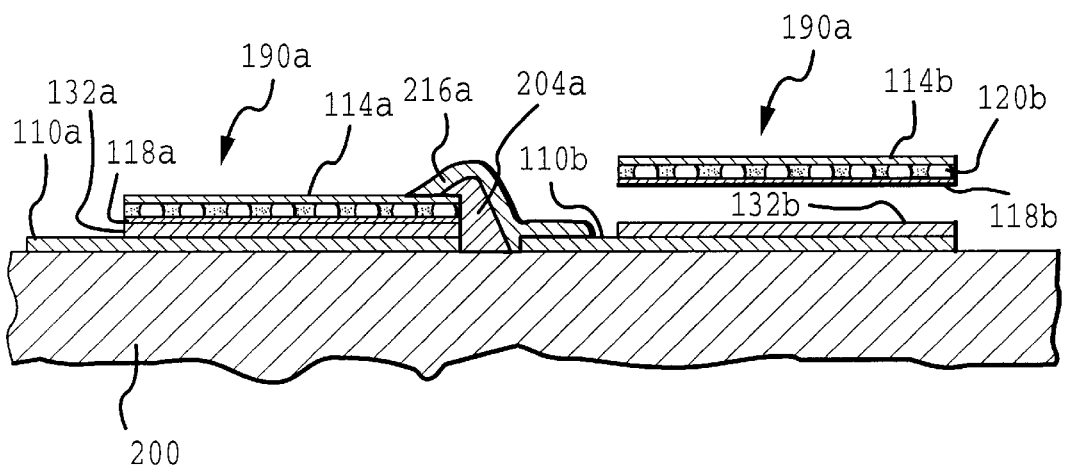
Figure 13:
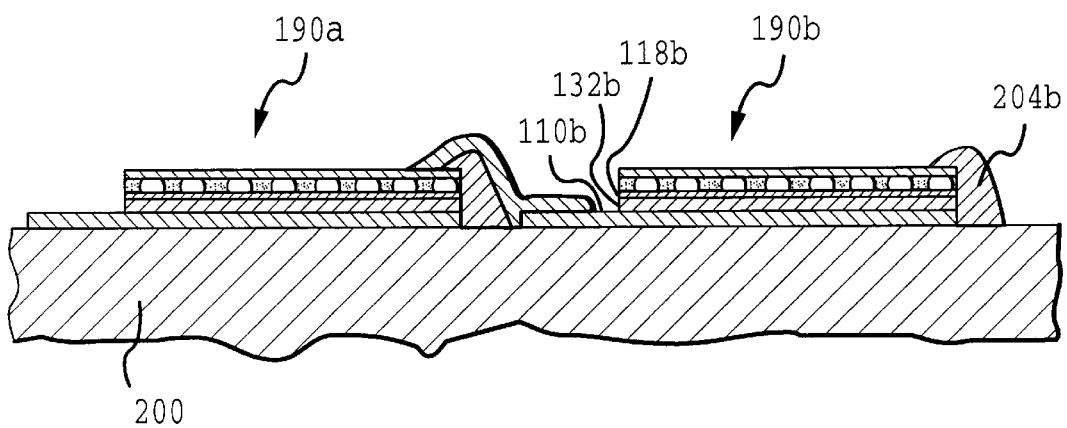

As noted previously with reference to FIGS. 5–7, the flexible strips 190 need not have all films necessary to make a photovoltaic cell. FIGS. 11–13 show one embodiment of the present invention for forming a plurality of interconnected photovoltaic cells on the supporting substrate 200 using flexible strips of 190 which do not comprise all of the films of a complete photovoltaic cell. Referring first to FIG. 11, the base substrate 200 is provided having a plurality of first electrode films 110a, 110b supported on the base substrate 200. The first flexible strip 190a comprises a first semiconductor film 118a, a second semiconductor film 120a and a second electrode film 114a, all of a type as previously described with reference to FIGS. 2–4. The first electrode films 110a, 110b are separated by a photovoltaic cell interconnection region 212. On top of the first electrode film 110a is placed a first Z-direction conductive film 132a. Positioned above the first Z-direction conductive film 132a is the first flexible strip 190a. The first Z-direction conductive film 132a may be a Z-direction conductive tape such as previously described with reference to FIG. 4. Such Z-direction conductive tape has an adhesive on both surfaces so that it may be adhered to the first electrode film 110a on one surface by the application of pressure and may be then adhered on the other surface to the first semiconductor film 118a of the first flexible strip 190a, also by application of pressure.

Referring to FIG. 12, the first flexible strip 190a is adhered to the first Z-direction conductive film 132a to form a complete first photovoltaic call comprising the film layers of the flexible strip 190a, the first Z-direction conductive film 132a and the first electrode film 110a. The photovoltaic cell would, therefore, have a configuration as previously described with reference to FIG. 4. For a backwall photovoltaic cell configuration, the first electrode film 110a and the first Z-direction conductive film 132a should be optically transmissive. The supporting substrate 200 should also be optically transmissive, such as a sheet of glass, for the embodiment shown in FIGS. 11–13. The first electrode film 110a may be, for example, a tin oxide film and the first semiconductor film 118a may be cadmium sulfide.

Also shown in FIG. 12, the first strip 204a of electrically insulating material is placed at an edge of the first flexible strip 190a. An electrically conductive interconnection film 216a is deposited over the first strip 204a to connect the second electrode film 114a of the first flexible strip 190a with the first electrode film 110b. On the first electrode film 110b is placed a second z-direction conductive film 132b, above which is positioned a second flexible strip 190b.

Referring to FIG. 13, a second photovoltaic cell is shown completed which comprises the first electrode film 110b, the second Z-direction conductive film 132b and the film layers of the second flexible strip 190b. The second photovoltaic cell is electrically interconnected with the first photovoltaic cell through the electrically conductive interconnection film 216a. A second strip 204b of electrically insulating material has been placed at the edge of the second photovoltaic cell in anticipation of electrical interconnection with one or more additional photovoltaic cells which could be added in a photovoltaic module.

It should be recognized that, according to the embodiment as described with respect to FIGS. 11–13, it would be possible to first locate all of a plurality of photovoltaic cells on the supporting substrate 200 and then to electrically interconnect all photovoltaic cells by screen printing or offset printing, in a single application, a plurality of strips 204 of electrically insulating material, followed by screen printing or offset printing of a plurality of electrically conductive interconnecting strips 216.

As described with reference to FIGS. 5–13, the present invention provides a method in which particles of a semiconductor material may be incorporated into a photovoltaic module substantially without altering the bulk crystal morphology of the semiconductor material in the particles. This represents a substantial improvement over existing methods, such as those used to prepare cadmium telluride-containing photovoltaic devices, in which recrystallization of a semiconductor material occurs following reposition in order to obtain suitable crystal morphology for use in the photovoltaic module.

It should be recognized that any of the features of any embodiment described herein may be combined in any combination with any other embodiment described herein. For example, any of the features of the photovoltaic cells of FIGS. 2–4 may be combined with any of the other features of any of the photovoltaic cells of FIGS. 2–4. Any combination of films of any of the photovoltaic cells of FIGS. 2–4, which include the second semiconductor film 120, may be prepared according to the process described with reference to FIGS. 5–7. Any flexible strips prepared according to the method described with respect to FIGS. 5–7 may be used with any of the embodiments described with reference to FIGS. 8–13 for making a photovoltaic module having a plurality of electrically interconnected photovoltaic cells supported on a common base substrate.

Also, while various embodiments of the present invention have been described in detail, it is apparent that modifications and adaptations of those embodiments will occur to those skilled in the art. It is to be expressly understood, however, that such modifications or adaptations are within the scope of the present invention, as set forth in the following claims.

What is claimed is:

1. A method for making a photovoltaic device having a plurality of interconnected photovoltaic cells structurally supported by a common supporting substrate, which reduces the need for processing of the supporting substrate during manufacture of the photovoltaic cells, the method comprising the steps of:

providing a sheet having a film comprising a semiconductor material which could be used in a photovoltaic cell;

cutting said sheet to provide a plurality of individual, unconnected pieces each having a film comprising said semiconductor material;

providing a permanent supporting substrate separate from said pieces;

locating a plurality of photovoltaic cells adjacent to said supporting substrate such that each of said plurality of photovoltaic cells receives some structural support from said supporting substrate; and electrically interconnecting said plurality of photovoltaic cells;

wherein, each of said plurality of photovoltaic cells comprises at least one of said pieces having a film comprising said semiconductor material.

2. The method of claim 1, wherein:

said sheet and each of said pieces are flexible.

3. The method of claim 1, wherein:

each of said pieces comprises an elongated strip.

4. The method of claim 1, wherein:

said step of providing said sheet comprises providing a surrogate substrate on which said sheet is supported and separating at least a portion of said sheet from said surrogate substrate.

5. The method of claim 1, wherein:
said supporting substrate is substantially rigid.

6. The method of claim 1, wherein:
said supporting substrate is substantially transparent to sunlight.

7. The method of claim 1, wherein:
said supporting substrate comprises glass.

8. The method of claim 1, wherein:
said supporting substrate, prior to said step of locating, has supported thereon an electrode film; and said step of locating comprises positioning said pieces adjacent to said electrode film.

9. The method of claim 1, wherein:
said film is a first film of said sheet and said sheet further comprises a second film which forms a heterojunction with said first film, said heterojunction being capable of producing electrical power when placed in a photovoltaic cell.

10. The method of claim 1, wherein:

said sheet further comprises an electrode film which is electrically interconnected with said semiconductor film.

11. The method of claim 1, wherein:

said semiconductor material comprises a metal chalcogenide selected from the group consisting of a metal sulfide, a metal selenide and a metal telluride.

12. The method of claim 1, wherein:

the method further comprises encapsulating, following said steps of locating and electrically interconnecting, said plurality of photovoltaic cells to project said photovoltaic cells from an external environment.

* * * * *